United States Patent
Kino et al.

(10) Patent No.: US 8,196,294 B2
(45) Date of Patent: Jun. 12, 2012

(54) COMPONENT SUPPLY METHOD

(75) Inventors: Toshiyuki Kino, Saga (JP); Takeyuki Kawase, Saga (JP); Tomio Tanaka, Fukuoka (JP); Yuji Tanaka, Fukuoka (JP)

(73) Assignee: Panasonic Corporation, Osaka (JP)

( * ) Notice: Subject to any disclaimer, the term of this patent is extended or adjusted under 35 U.S.C. 154(b) by 272 days.

(21) Appl. No.: 12/132,262

(22) Filed: Jun. 3, 2008

(65) Prior Publication Data

US 2008/0313890 A1 Dec. 25, 2008

(30) Foreign Application Priority Data

Jun. 19, 2007 (JP) ................. 2007-161067

(51) Int. Cl.
*H05K 3/30* (2006.01)
(52) U.S. Cl. .............. 29/832; 29/833; 29/834; 29/741; 226/110
(58) Field of Classification Search ............ 29/832–834, 29/729, 739, 740–742; 226/110, 128, 148; 228/180.22, 180.1
See application file for complete search history.

(56) References Cited

U.S. PATENT DOCUMENTS

| 6,086,641 | A  | * | 7/2000  | Shironouchi ............... 29/25.01 |
| 6,199,738 | B1 | * | 3/2001  | Kondo et al. ............... 226/110 |
| 6,223,425 | B1 | * | 5/2001  | Asai et al. ................. 29/740 |
| 6,480,751 | B1 | * | 11/2002 | Kuribayashi et al. .......... 700/56 |
| 6,839,959 | B1 | * | 1/2005  | Hosotani et al. ............. 29/740 |
| 7,273,166 | B2 | * | 9/2007  | Suhara et al. ............... 235/376 |
| 7,337,533 | B2 | * | 3/2008  | Imafuku et al. .............. 29/739 |
| 7,458,147 | B2 | * | 12/2008 | Kawase et al. ............... 29/833 |
| 7,568,610 | B2 | * | 8/2009  | Sakai et al. ............. 228/180.22 |

FOREIGN PATENT DOCUMENTS

| JP | 2000-307290 | A | 11/2000 |
| JP | 2004-335951 | A | 11/2004 |
| JP | 2004-342874 | A | 12/2004 |
| JP | 2006-108375 | A | 4/2006 |

OTHER PUBLICATIONS

Chinese Office Action for Application No. 200810125313.4, filed Nov. 9, 2010, Panaspnic Corporation.

* cited by examiner

*Primary Examiner* — Minh Trinh
(74) *Attorney, Agent, or Firm* — RatnerPrestia

(57) ABSTRACT

A method of mounting supply components includes the step of inserting dish-like members into a base. Each dish-like member holds components. One dish-like member can stay inserted in the base while the other dish-like member is removed from the base and refilled with components.

1 Claim, 12 Drawing Sheets

COMPONENT SUPPLY METHOD

BACKGROUND OF THE INVENTION

1. Field of the Invention

The present invention relates to a component mounter for picking up a component using a transfer head and placing it on a board, and a component supply method of component mounters.

2. Background Art

Conventional component mounters are disclosed in, for example, Japanese Patent Unexamined Publication No. 2000-307290 and Japanese Patent Unexamined Publication No. 2004-342874. These types of conventional component mounters pick up a component supplied from a part feeder by a transfer head, and place it on a board positioned using a board transfer rail. A tray feeder is known as a kind of part feeder.

A great number of components are stored in each tray, and multiple trays are placed on a pallet (a dish member). The pallet is slidably disposed at a main body. The tray feeder draws out a pallet, on which a tray containing components to be picked up is placed, and supplies this tray to the movement area of the transfer head.

The tray feeder houses different types of components on each tray, and supplies each tray to the component mounter. One advantage of the tray feeder is therefore that it can supply various components to suit each type of board. However, a disadvantage of the tray feeder is that it is extremely expensive. Therefore, to keep equipment costs low, an operator opens the cover of the component mounter and manually places (installs) the tray into the component mounter, instead of using the tray feeder.

However, if the cover of the component mounter is opened to install the tray into the component mounter, normally a safety device is activated to forcibly stop the mounting operation. As a result, even when only one tray of the multiple trays installed in the component mounter needs a component refill, it is not possible to take out only that tray from the component mounter. Therefore, it is necessary to wait until the components in all the other trays are consumed before component refill. In addition, the operator needs to adopt an uncomfortable posture while installing the tray into the component mounter. Accordingly it may result in dropping the tray inside the mounter by mistake.

SUMMARY OF THE INVENTION

A component mounter of the present invention has the next structure. The component mounter of the present invention includes a board transfer rail for positioning a board at a predetermined position on a base, and a transfer head for picking up a component supplied and placing it on the board positioned by the board transfer rail. In addition, the component mounter of the present invention includes multiple dish members, which is inserted to the base and supplies components placed on them to a movement area of the transfer head. These dish members are independently removable from the base.

A component supply method of the component mounter of the present invention is a component supply method of the component mounter including the board transfer rail for positioning the board at a predetermined position on the base, and the transfer head for picking up the supplied component and placing it on the board positioned by the board transfer rail. The component supply method of the component mounter of the present invention includes the step of inserting multiple dish members to the base in an independently removable manner and supplying the components placed on each dish member to the movement area of the transfer head; and the step of removing the dish member that needs component refill from the base, and inserting that dish member back to the base after refilling with components.

With the above structure of the component mounter and the component supply method of the present invention, multiple removable dish members are inserted to the base, and components placed on each dish member are supplied to the movement area of the transfer head. Accordingly, a wide variety of components can be supplied as in the conventional tray feeder, using an inexpensive structure if different types of components are placed in each dish member. In addition, since each dish member is independently removable from the base, only the dish member that needs refilling can be removed from the base, and that dish member is inserted back to the base after refilling with components. There is thus no need to open the cover of the component mounter to refill with components, and the mounting operation thus does not stop because the safety device is not activated. Furthermore, since the dish member is removable from outside the base, an operator does not need to physically place the dish member inside the mounter. This also facilitates component refill.

DETAILED DESCRIPTION OF THE INVENTION

Figure 1:
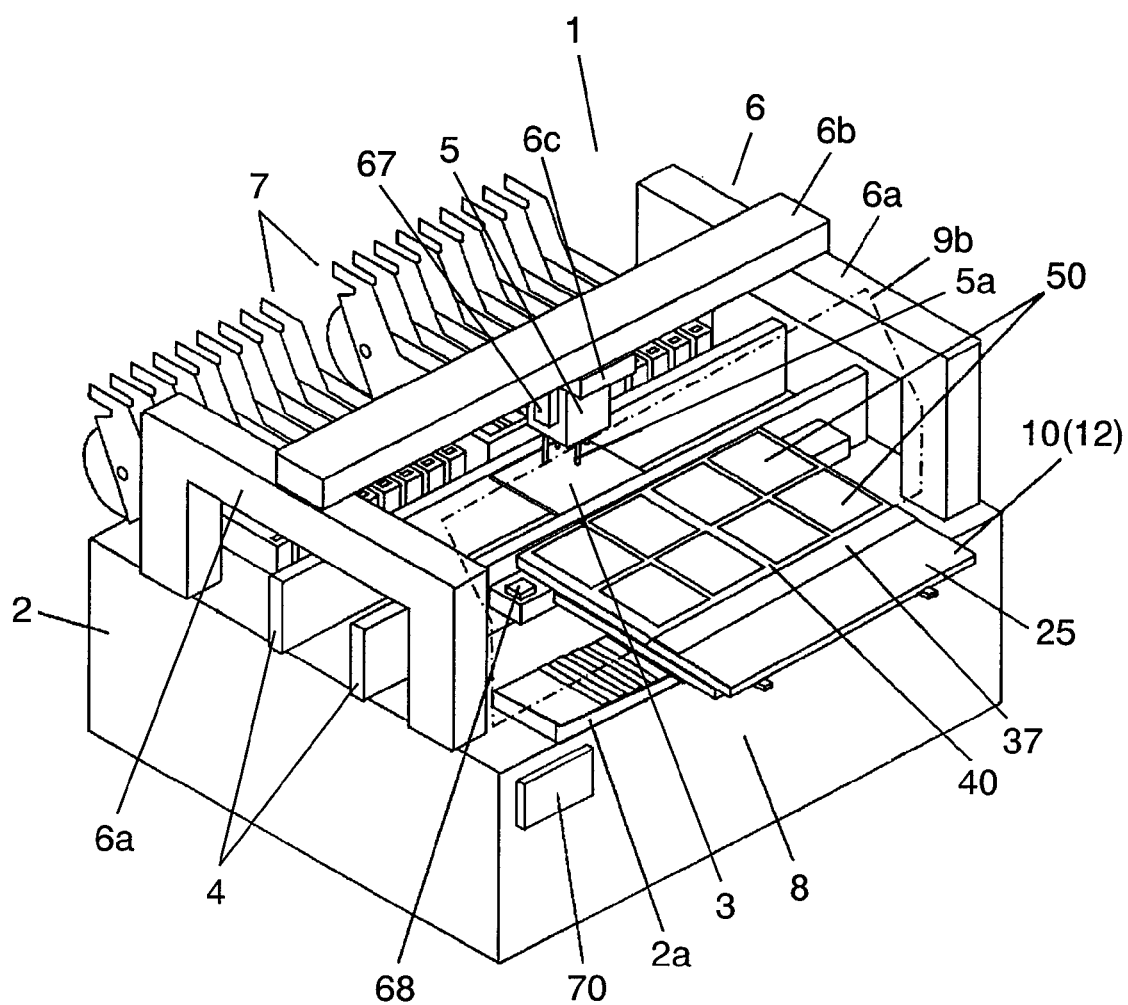
FIG. 1 is a perspective view of a component mounter in accordance with a preferred embodiment of the present invention.
Figure 2:
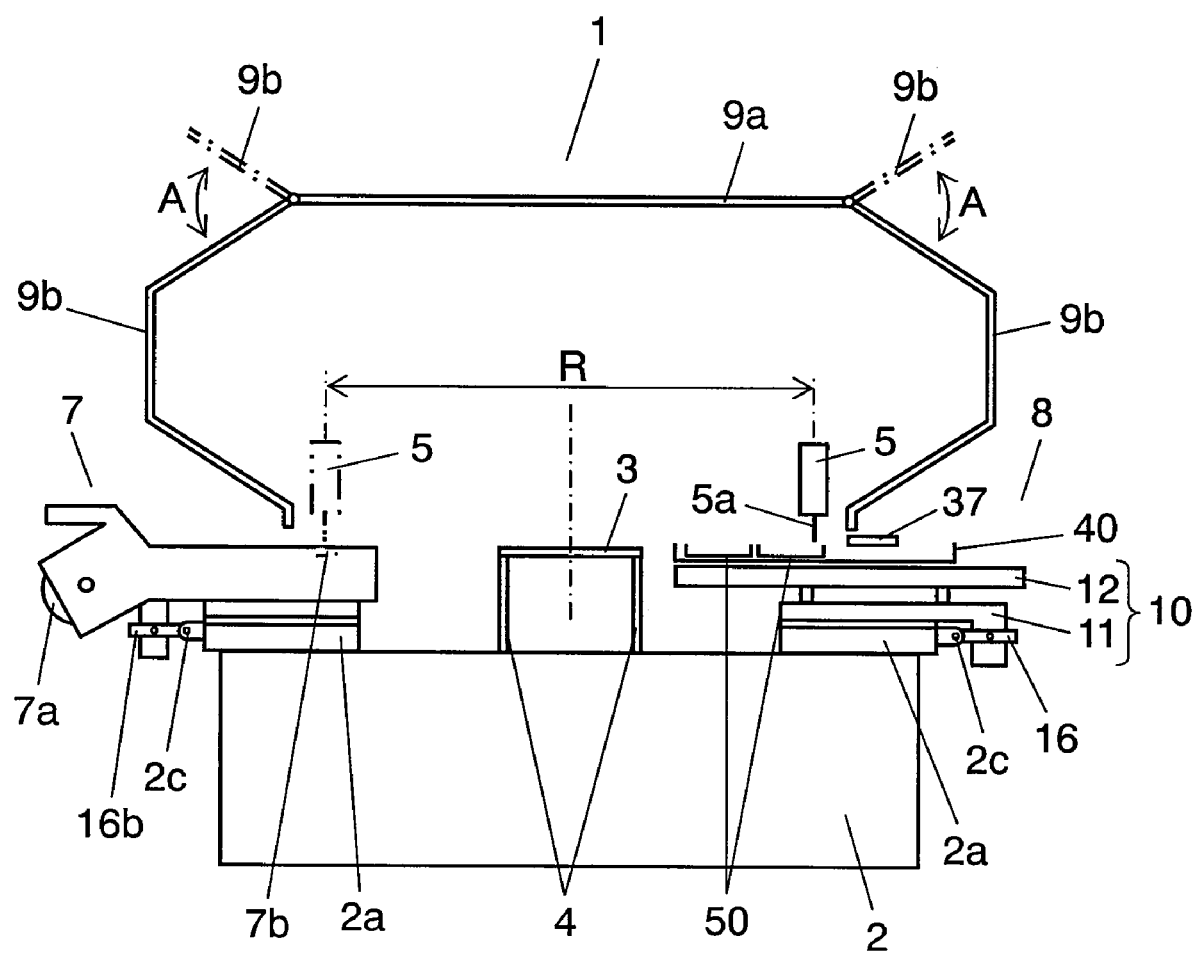
FIG. 2 is a side view of the component mounter shown in FIG. 1.
Figure 3:
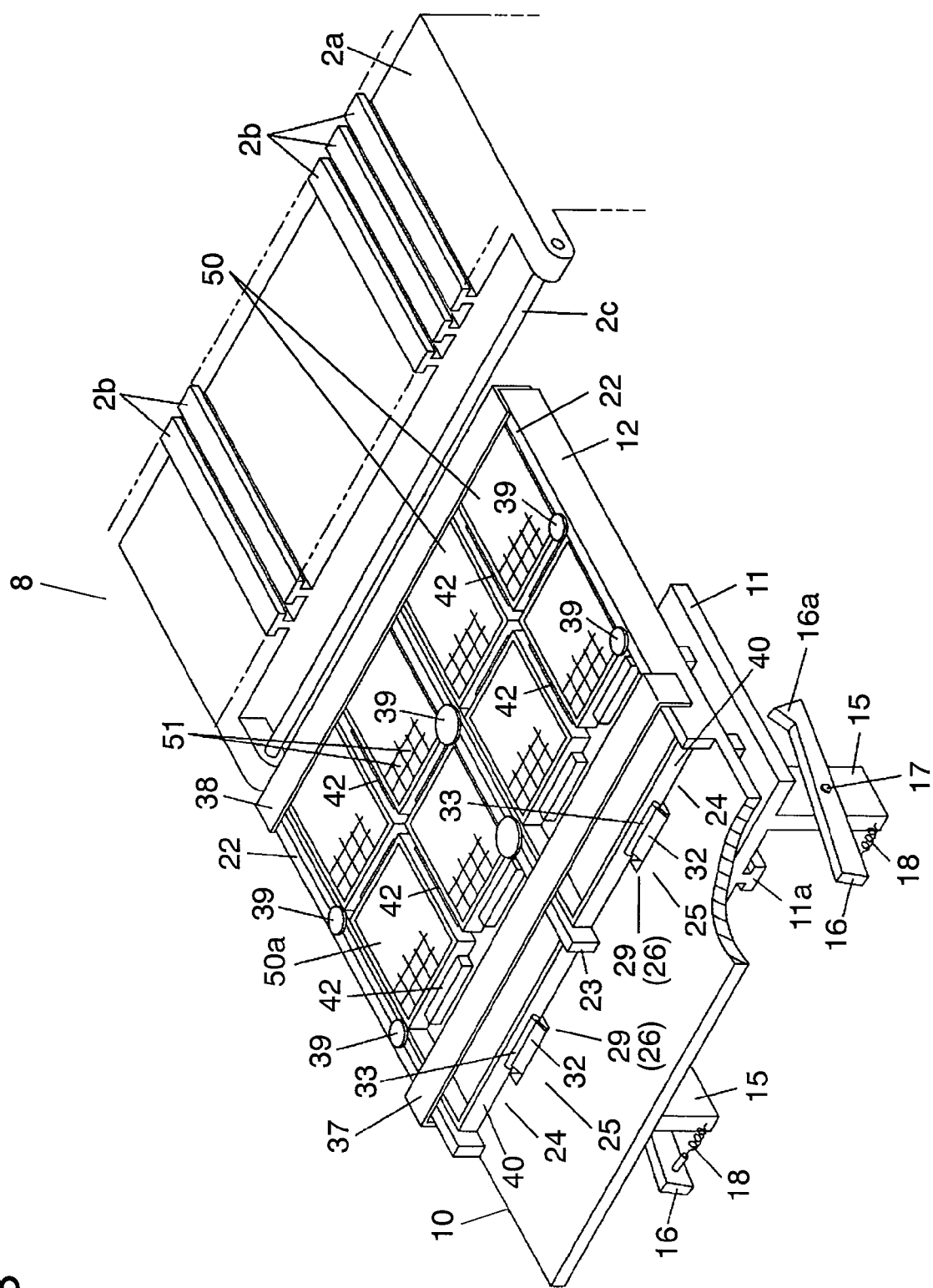
FIG. 3 is a perspective view of a hand tray of a component feeder shown in FIG. 1.
Figure 4:
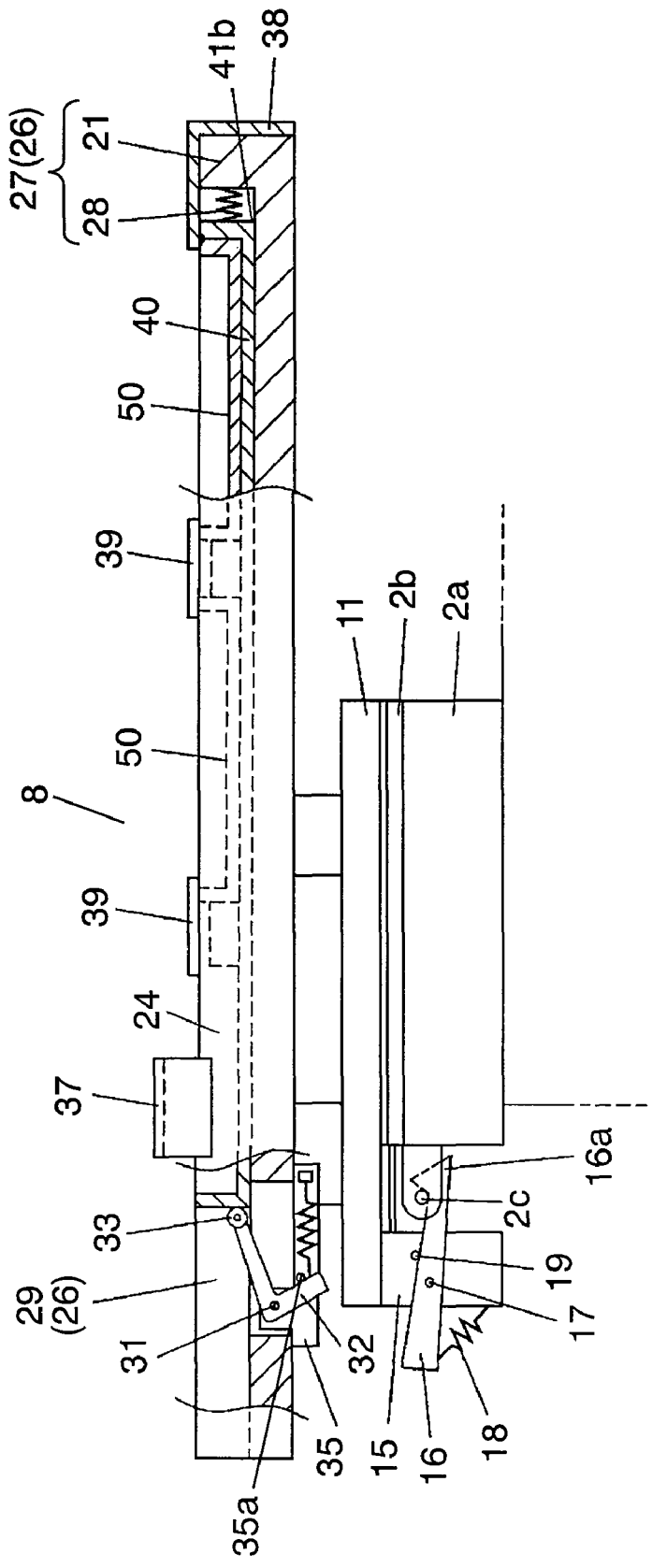
FIG. 4 is a side view of the hand tray shown in FIG. 3.
Figure 5:
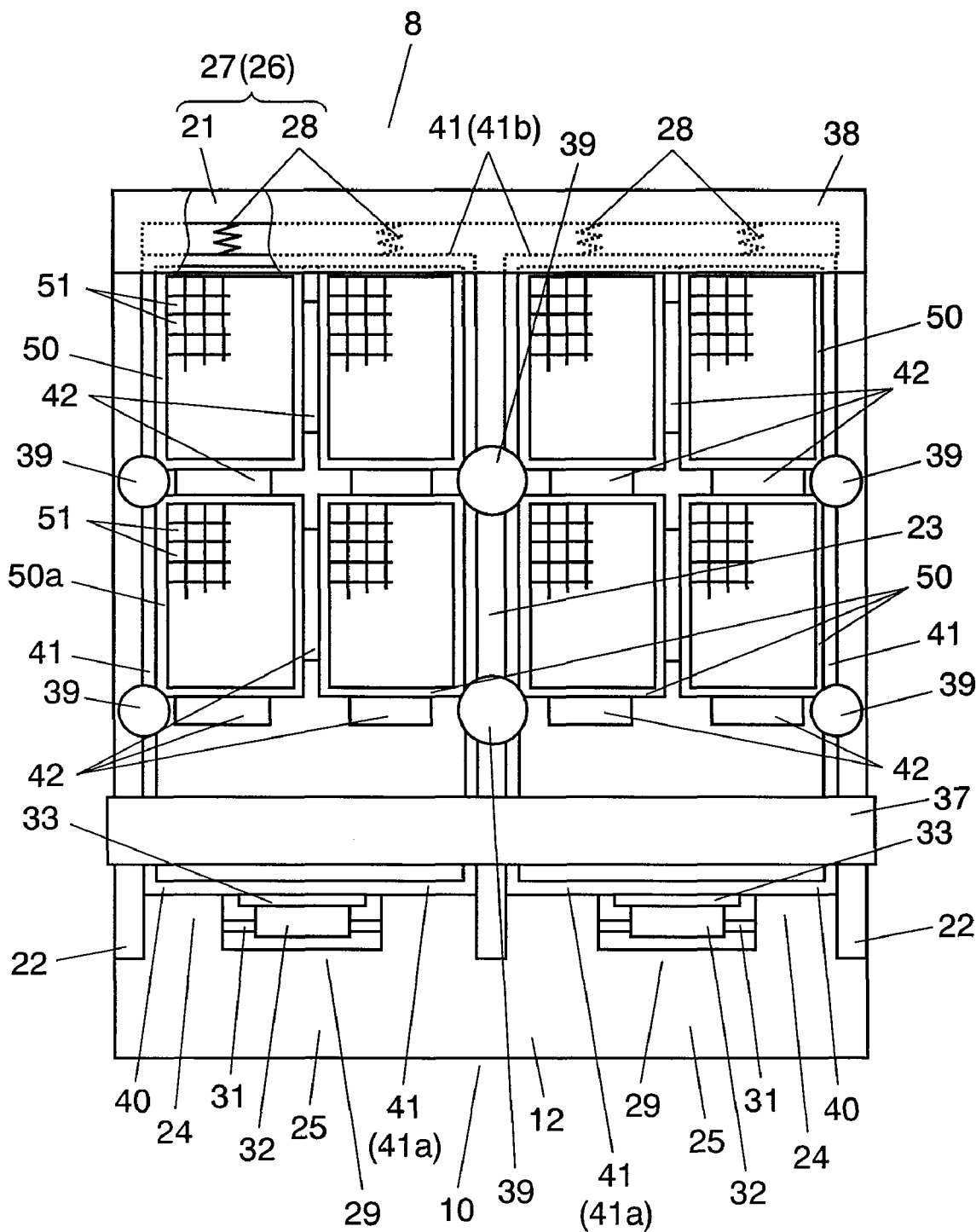
FIG. 5 is a plan view of the hand tray shown in FIG. 3.
Figure 6A:
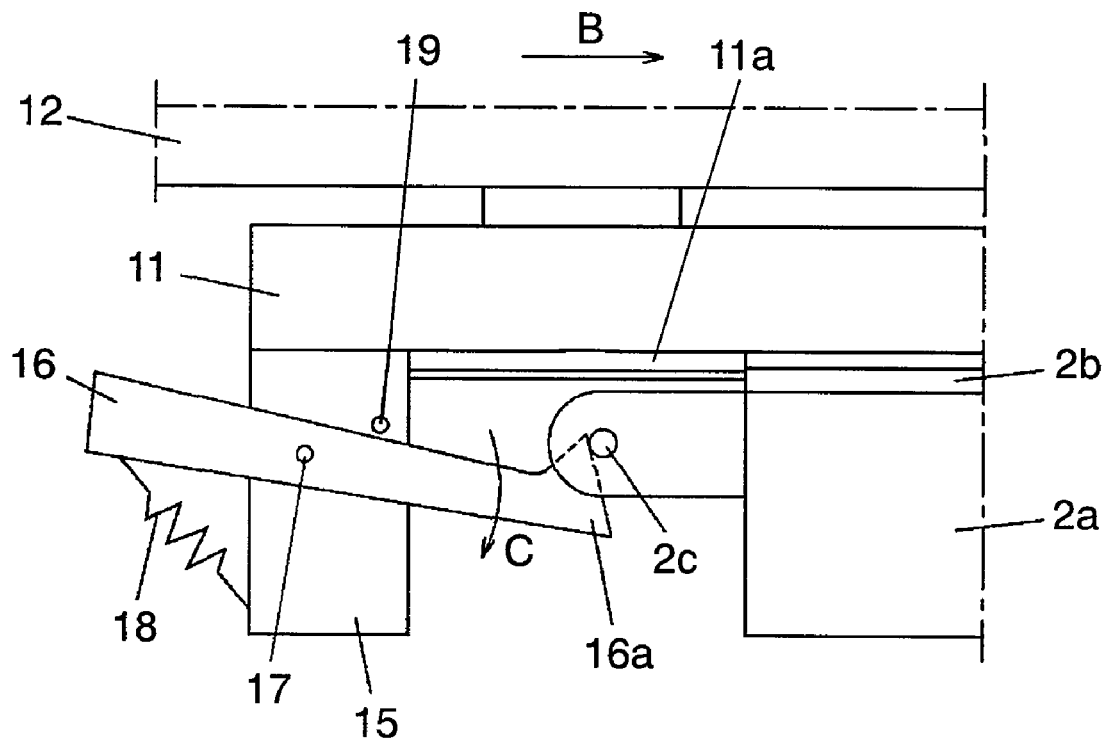
FIG. 6A is a partial side view of the hand tray shown in FIG. 3.
Figure 6B:
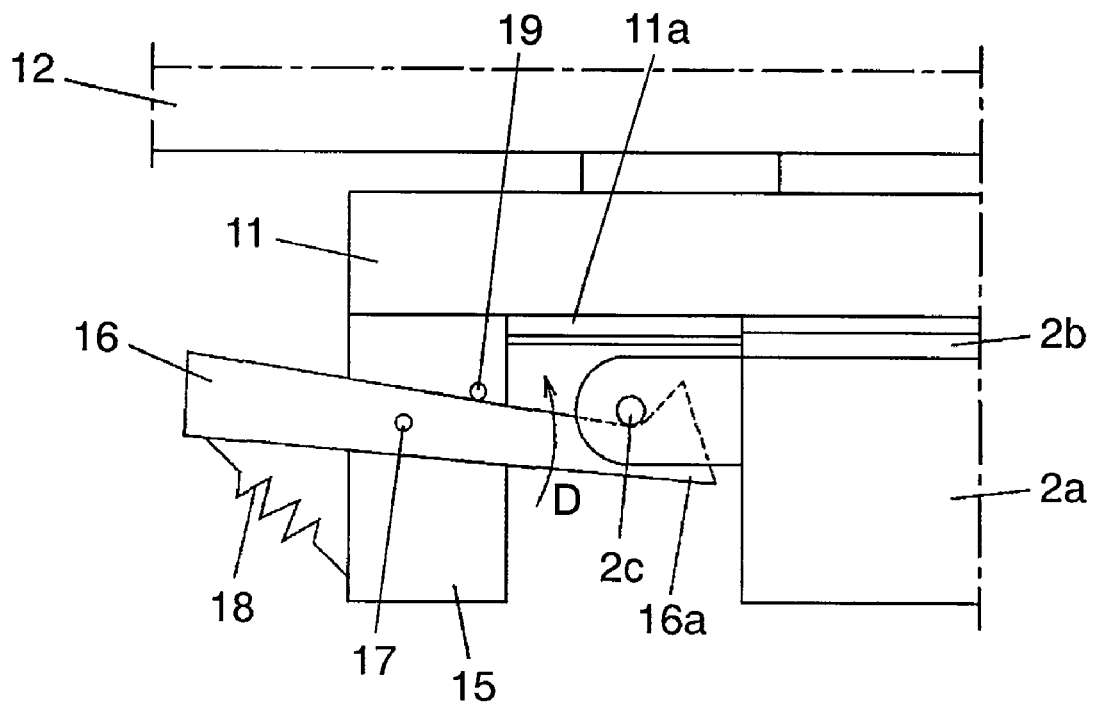
FIG. 6B is a partial side view of the hand tray shown in FIG. 3.
Figure 7:
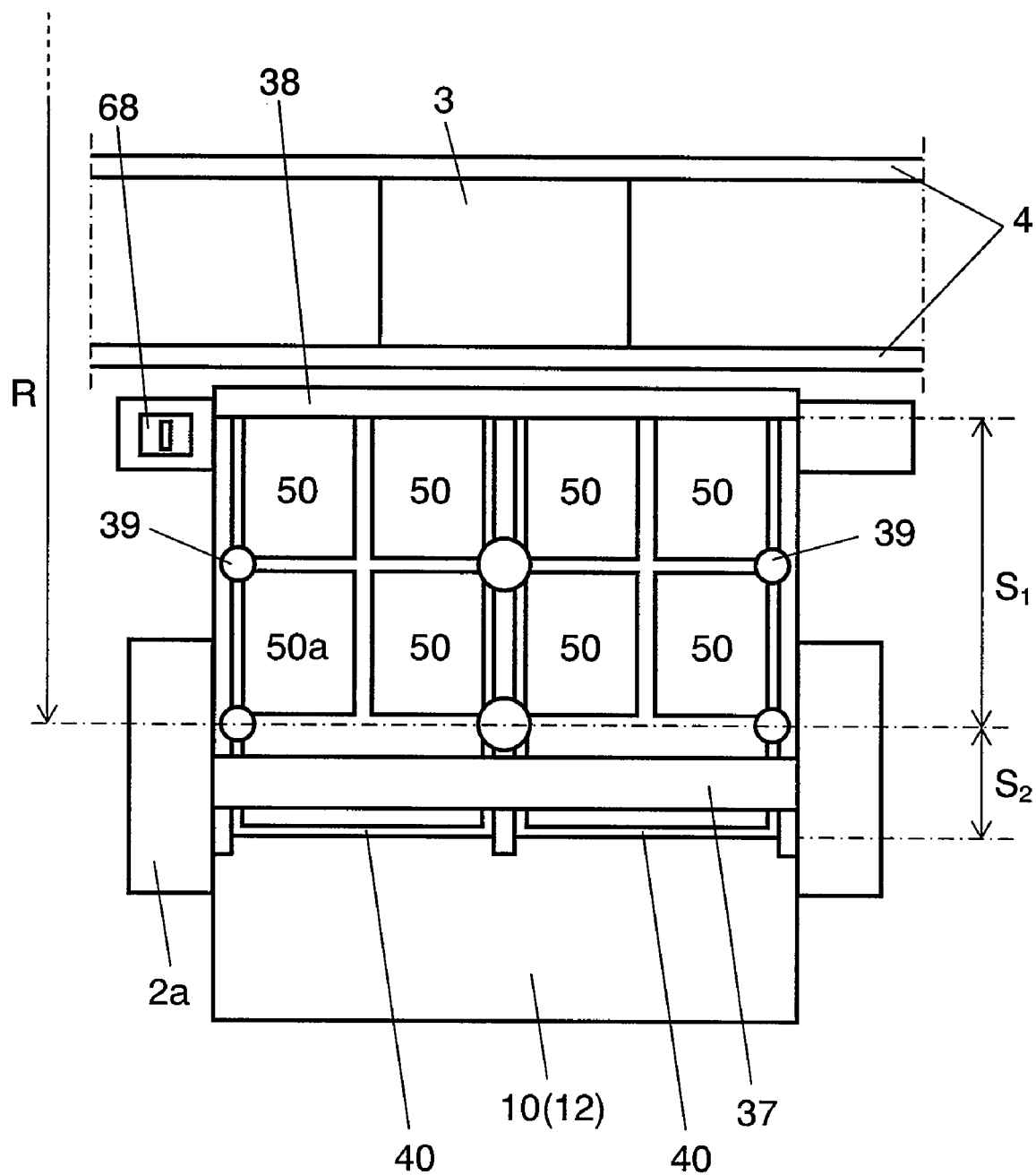
FIG. 7 is a plan view of the hand tray shown in FIG. 3.
Figure 8A:
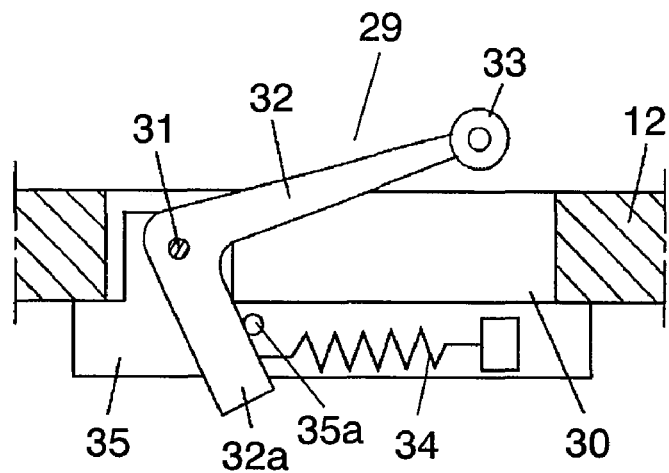
FIG. 8A is a partial side view of the hand tray shown in FIG. 3.
Figure 8B:
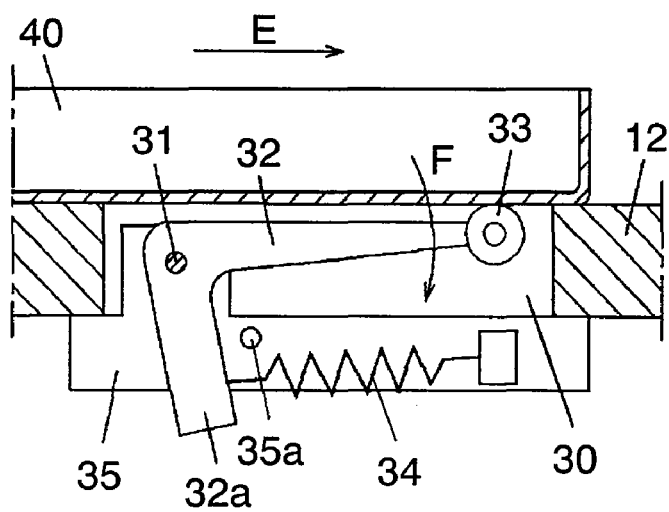
FIG. 8B is a partial side view of the hand tray shown in FIG. 3.
Figure 8C:
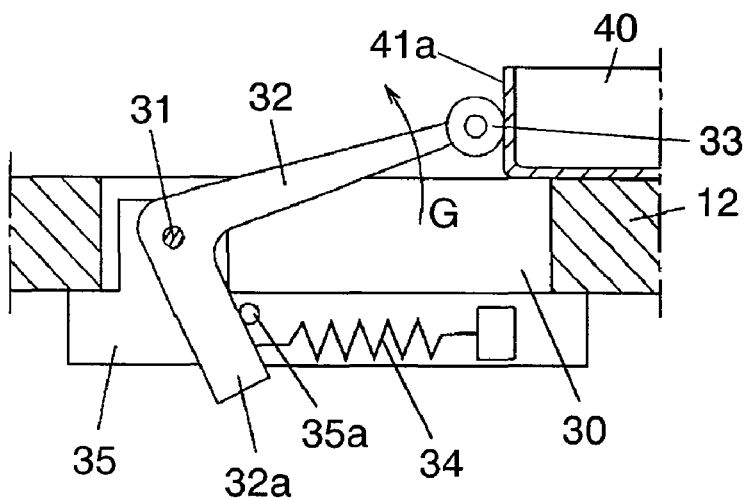
FIG. 8C is a partial side view of the hand tray shown in FIG. 3.
Figure 9:
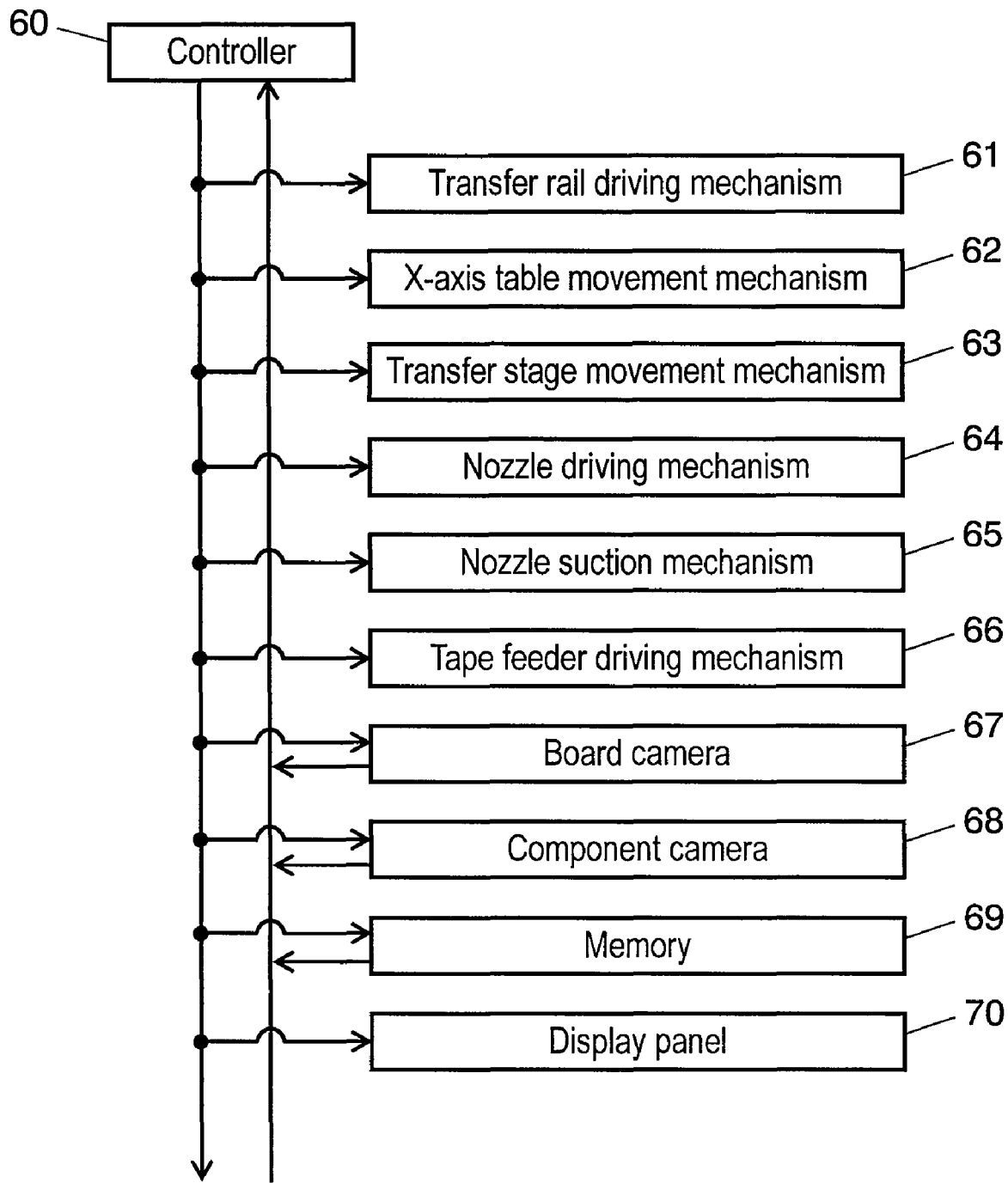
FIG. 9 is a block diagram including a control system of the component mounter in the preferred embodiment of the present invention.
Figure 10:
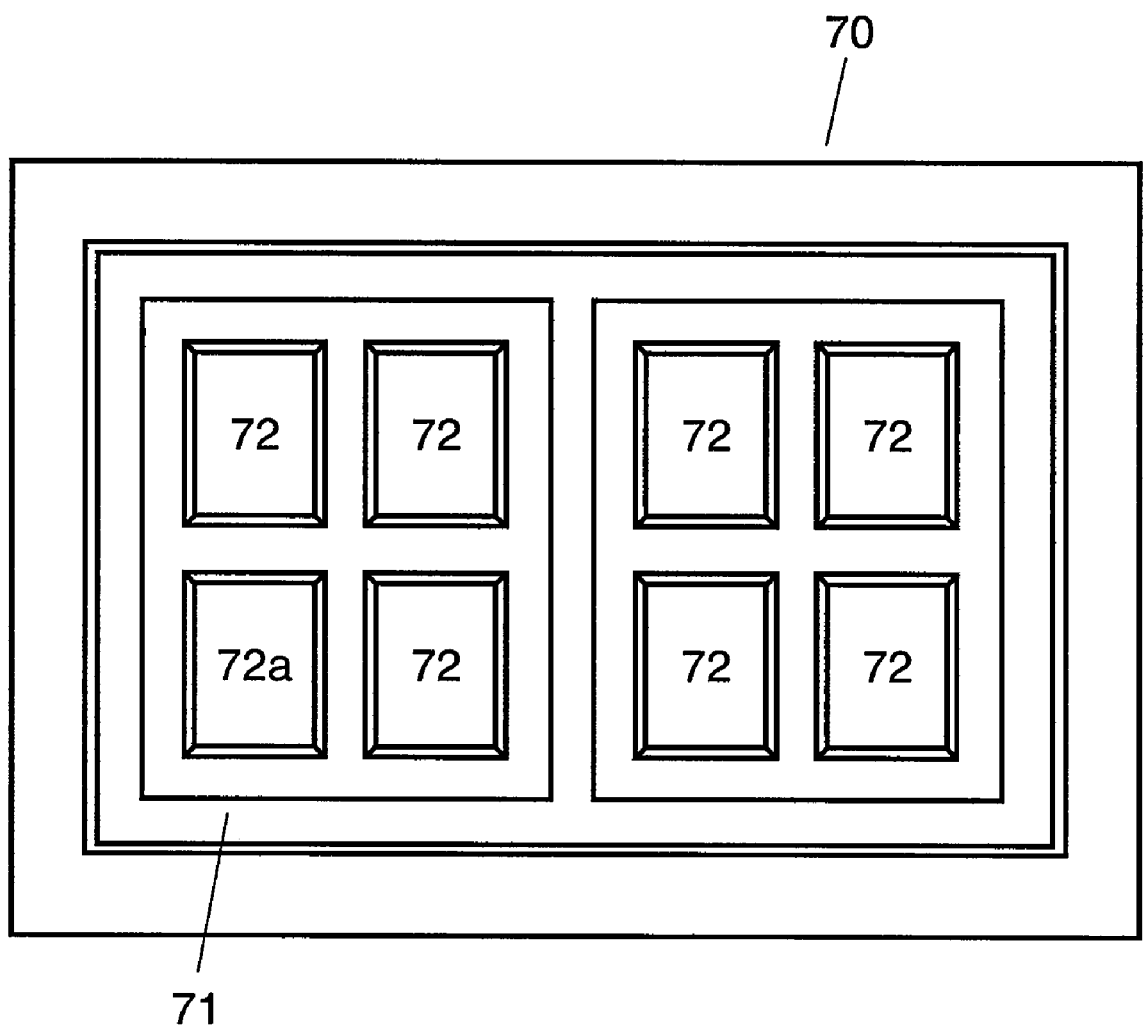
FIG. 10 is an example of a display section of a display panel on the component mounter shown in FIG. 1.
Figure 11:
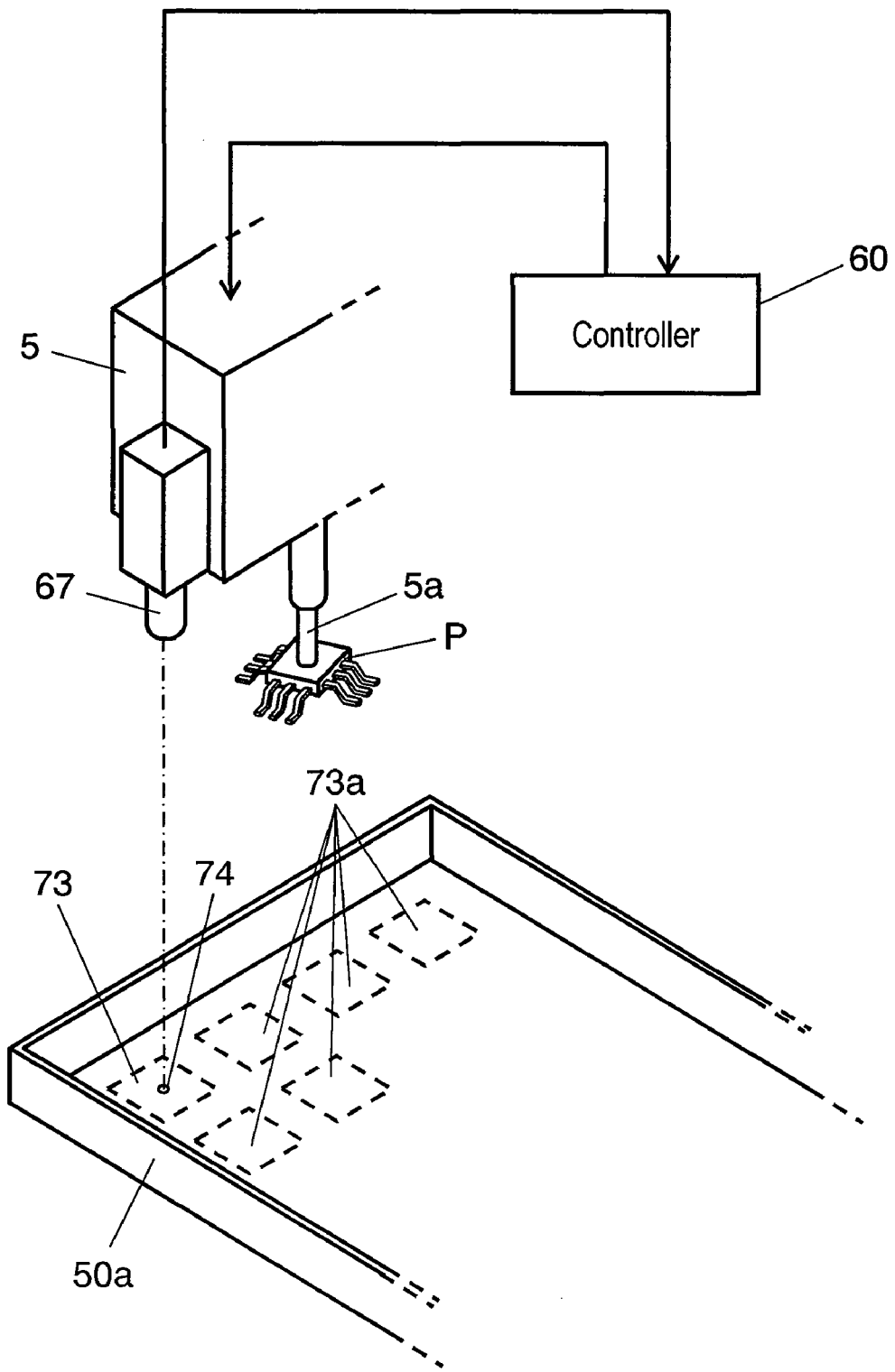
FIG. 11 is a vacant space detector of the component mounter shown in FIG. 1.

A preferred embodiment of the present invention is described below with reference to drawings. FIG. 1 is a perspective view of a component mounter, and FIG. 2 is a side view of the component mounter shown in FIG. 1. FIG. 3 is a perspective view of a hand tray of a component feeder shown in FIG. 1. FIG. 4 is a side view of the hand tray shown in FIG. 3, and FIG. 5 is a plan view of the hand tray shown in FIG. 3. FIGS. 6A and 6B are partial side views of the hand tray shown in FIG. 3. FIG. 7 is a plan view of the hand tray shown in FIG. 3. FIGS. 8A to 8C are partial side views of the hand tray shown in FIG. 3. FIG. 9 is a block diagram including a control system of the component mounter in the preferred embodiment of the present invention. FIG. 10 is an example of a display section of a display panel on the component mounter shown in FIG. 1. FIG. 11 is a vacant space detector of the component mounter shown in FIG. 1.

First, a basic structure of the component mounter in the preferred embodiment of the present invention is described with reference to FIGS. 1 and 2. Component mounter 1 includes board transfer rail 4 for positioning board 3 at a predetermined position on base 2, and transfer head 5 for picking up a component supplied and placing it on board 3 positioned by board transfer rail 4. Component mounter 1 also includes multiple dish members 40 inserted to base 2. Dish members 40 supply components placed on them to a movement area of transfer head 5. Each dish member 40 is independently removable from base 2.

A component supply method for component mounter 1 of the present invention is the component supply method of a component mounter including board transfer rail 4 for positioning board 3 at a predetermined position on base 2, and transfer head 5 for picking up the component supplied and placing it on board 3 positioned by board transfer rail 4. This component supply method includes the step of inserting multiple dish members 40, which are independently removable from base 2, to base 2 and supplying components placed on each dish member 40 to the movement area of transfer head 5; and the step of removing dish member 40 that needs component refill from base 2, and inserting that dish member 40 back to base 2 after refilling with components.

Next, a detailed structure of the component mounter in the preferred embodiment of the present invention is described also with reference to FIGS. 1 and 2. In FIGS. 1 and 2, component mounter 1 includes board transfer rail 4 for conveying board 3 on base 2, and positioning board 3 at a predetermined position on base 2. Component mounter 1 also includes transfer head 5 with multiple nozzles 5a extending downward over base 2. Transfer head movement mechanism 6 moves transfer head 5 relative to board 3 positioned by board transfer rail 4. Transfer head movement mechanism 6 includes Y-axis table 6a, X-axis table 6b, and transfer stage 6c.

A pair of Y-axis tables 6a extend on a horizontal plane in a direction orthogonal (Y-axis direction) to a direction that board transfer rail 4 extends (X-axis direction), and face X-axis table 6b. X-axis table 6b is supported by the pair of Y-axis tables 6a at its both ends, and extends in the X-axis direction. Transfer stage 6c is disposed on X-axis table 6b in a movable manner along the X-axis direction, and holds transfer head 5.

Multiple tape feeders 7 are detachably provided at one side area of board transfer rail 4. Hand tray 8 is detachably provided at the other side area of board transfer rail 4.

Fixed cover 9a covers an upper area of base 2. Movable cover 9b covers an area directly above tape feeder 7 and hand tray 8 attached to base 2. This movable cover 9b is openable relative to fixed cover 9a (arrow A in FIG. 2).

Tape feeder 7 and hand tray 8 are detachably attached to feeder bases 2a opposing each other on base 2 with board transfer rail 4 in between. These feeder bases 2a are provided originally for attaching tape feeder 7. However, in component mounter 1 in the preferred embodiment, hand tray 8 is attachable to this feeder base 2a for attaching the tape feeder.

Tape feeder 7 consecutively supplies components on a tape wound around reel 7a to component supply inlet 7b. This tape feeder 7 is designed such that its component supply inlet 7b is set within movement area R of transfer head 5 when tape feeder 7 is attached to feeder base 2a.

As shown in FIGS. 3, 4, and 5, hand tray 8 includes pallet table 10 detachably disposed on feeder base 2a, and multiple pallets 40 (two in this preferred embodiment) that are dish members independently removable from base 2 via pallet table 10. Multiple trays 50 containing a great number of components are placed on the top face of each dish member 40. See also FIG. 12, step a).

Pallet table 10 includes lower stage 11 attached to feeder base 2a and upper stage 12 provided over lower stage 11. Multiple guides 2b extending in the front-back direction of feeder base 2a (in a direction orthogonal to board transfer rail 4 on a horizontal plane) are aligned in the right-left direction (in a direction that board transfer rail 4 extends) on feeder base 2a. These guides 2b have T-shaped cross sections. Multiple protrusions 11a, whose cross sections are T-shaped to fit into T-shaped slots formed between these guides 2b, are provided on the bottom face of lower stage 11. These protrusions 11a extend in the front-back direction of hand tray 8 (FIG. 3).

Lock attachment member 15 extends downward at the back of lower stage 11 of pallet table 10. Locking bar 16 is attached to this lock attachment member 15, in an oscillatable manner, around oscillating shaft 17 extending horizontally. Spring 18 provided between locking bar 16 and lock attachment member 15 continuously applies an upward force to a front end of locking bar 16. Stopper 19 that restricts upward movement of the front end of locking bar 16 is provided on lock attachment member 15. Locking bar 16, whose front end is given the upward force by spring 18, retains the state that it contacts stopper 19 from beneath. Hook 16a having a tilted face sloping down toward the front is provided at the front end of locking bar 16.

Protrusions 11a on pallet table 10 are fitted in between adjacent guides 2b on feeder base 2a, and pallet table 10 slides to the front of feeder base 2a (arrow B in FIG. 6A). Then, a pin (not illustrated) provided at the front end of pallet table 10 is fitted to a pin fitting part (not illustrated) formed on the top face of feeder base 2a so as to position pallet table 10 to feeder base 2a. At this point, the tilted face of hook 16a of locking bar 16 contacts rod-like hook catcher 2c provided on feeder base 2a, and hook 16a is pushed downward. (Arrow C in FIG. 6A. Alternatively, the rear end of locking bar 16 may be moved upward so that hook 16a is moved downward.) When pallet table 10 is positioned to feeder base 2a, hook 16a of locking bar 16 goes beyond hook catcher 2c. Then, spring 18 applies the upward force, and hook 16a is caught on hook catcher 2c from beneath (arrow D in FIG. 6B). This makes pallet table 10 locked to feeder base 2a. To release the lock, the rear end of locking bar 16 is moved upward so that hook 16a is released from hook catcher 2c from beneath.

In the state that pallet table 10 is attached to feeder base 2a, the bottom face of lower stage 11 in pallet table 10 contacts the top face of guides 2b of feeder base 2a from above. Upper stage 12 protrudes further to the front from lower stage 11 and thus its front end is close to board 3. (See FIGS. 2 and 7.) Protrusions same as protrusions 11a are provided on the bottom face of each tape feeder 7, and locking bar 16b (see FIG. 2) to be caught on hook catcher 2c, same as locking bar 16, is also provided. Accordingly, tape feeder 7 can be attached to feeder base 2a in the same way as pallet table 10.

Dish member 40 is a rectangular tray container made of magnetic material, and trays 50 with an open top are placed on the top face of dish member 40. Each tray 50 contains numerous partitioned component spaces 51 in a matrix (see FIGS. 3 and 5), and each component space 51 houses one component to be mounted on board 3 by component mounter 1. Tray 50 is fixed to dish member 40 using wall 41 (FIG. 5) surrounding dish member 40 or magnet 42 detachably provided on the top face of dish member 40. In the drawings, eight trays 50 are indicated, and one of them (at the left front in FIG. 5) is a tray for housing components collected without being mounted on board 3 (hereafter referred to as "component collecting tray 50*a*").

Upper stage 12 of pallet table 10 includes front wall 21 extending in the right-left direction at the front, side walls 22 extending in the front-back direction at both right and left ends, respectively, and center wall 23 extending in the front-back direction at the center. An area surrounded by front wall 21, center wall 23, and one side wall 22 is pallet section 24 that receives dish member 40. In this preferred embodiment, two pallet sections 24 are provided side by side in the right-left direction of dish member 40. However, three or more pallet sections 24 are also applicable. The back of each pallet section 24 is open to outside as pallet inlet 25.

Dish member 40 where trays 50 are placed and fixed on its top face is manually slid into pallet section 24 from pallet inlet 25 open to outside. Dish member 40 inserted from pallet inlet 25 is fixed on pallet table 10 by fixing unit 26 (described later) at a position that trays 50 on dish member 40 are placed within movement area R of transfer head 5.

In FIG. 7, an area on dish member 40 within movement area R of transfer head 5 becomes component pickup (and collection) area S1 of transfer head 5 when each dish member 40 is fixed onto pallet table 10. In reverse, area S2 on dish member 40, which is out of pickup area S1, is an area that transfer head 5 cannot pick up components. Accordingly, an operator needs to know the area that can be pickup area S1 on dish member 40 in advance, and position tray 50 on dish member 40 and position components in tray 50 such that all components to be mounted are housed within pickup area S1.

Fixing unit 26 includes positioner 27 (in FIGS. 4 and 5) and locking part 29 (FIGS. 3 to 5). Positioner 27 positions dish member 40 by making a front end of dish member 40 contact positioner 27 at a position that trays 50 placed in dish member 40 inserted to pallet table 10 enter movement area R of transfer head 5. Locking part 29 fixes the rear end of dish member 40, whose front end is in contact with positioner 27, in an unlockable manner. Positioner 27 is configured with front wall 21 of pallet table 10, and multiple elastic members 28 attached to the rear face of this front wall 21.

As shown in FIGS. 8A to 8C, locking part 29 includes oscillating bar 32, roller 33, and spring 34. Oscillating bar 32 is provided in hole 30 created vertically through upper stage 12 of pallet table 10, and is oscillatable around oscillating shaft 31 extending sideways of pallet table 10. Roller 33 is provided at the front end of oscillating bar 32, and is rotatable around a horizontal shaft. Spring 34 always applies a force to roller 33 and oscillating bar 32 in a direction that roller 33 rises.

Spring 34 applies the force to oscillating bar 32 in a direction that the front end of oscillating bar 32 rises, however this upward movement is restricted by making extended bar 32*a* extending downward contact from beneath stopper 35*a* of stopper plate 35 provided on the bottom face of pallet table 10. Oscillating shaft 31 is held by stopper plate 35, and thus the position of oscillating bar 32 is adjustable by changing the position of stopper plate 35 relative to pallet table 10.

Oscillating bar 32 is normally retained at a position (initial position) that its extended bar 32*a* comes in contact with stopper 35*a* (FIG. 8A). However, when dish member 40 is inserted from pallet inlet 25 (arrow E in FIG. 8B), roller 33 is pushed downward by the bottom face of dish member 40, and the front end of oscillating bar 32 oscillates downward so that oscillating bar 32 is hidden in hole 30 (arrow F in FIG. 8B). When dish member 40 passes over roller 33, oscillating bar 32 returns to its initial position by the force of spring 34 (arrow G in FIG. 8C). At this recovered position, roller 33 comes in contact with rear wall 41*a* of dish member 40 so that dish member 40 is locked in pallet section 24.

As shown in FIGS. 4 and 5, elastic members 28 attached to front wall 21 of pallet table 10 are typically made of spring or rubber, and apply a force toward locking part 29 to dish member 40 locked (fixed) in pallet section 24 by locking part 29. Accordingly, dish member 40 is sandwiched between elastic members 28 and oscillating bar 32 in the state that the rear end of dish member 40 is fixed by locking part 29. On the other hand, to remove dish member 40 from pallet table 10, roller 33 is pushed into hole 30 by pushing down oscillating bar 32 so as to release fixing of dish member 40 by oscillating bar 32. At this point, dish member 40 is ejected backward with elastic members 28, and thus dish member 40 can be easily pulled out from pallet table 10.

Height restriction member 37 is provided near pallet inlet 25 in a horizontal direction orthogonal to an inserting direction of dish member 40 on pallet table 10 (the front-back direction of pallet table 10). This height restriction member 37 restricts entrance of a component with a height exceeding a specified height in components contained in tray 50. Eventually, it restricts entrance of tray 50 and dish member 40 containing such components. This prevents erroneous supply of components with sizes not supposed to be supplied or components not properly placed in tray 50 to component mounter 1. In addition, this height restriction member 37 prevents a finger of the operator inserted through pallet inlet 25 by mistake from reaching movement area R of transfer head 5 in the state that no dish member 40 is inserted in pallet section 24.

First pallet holder 38 with L-shaped cross section is attached to the front end of pallet table 10, and extends sideways of pallet table 10. Flat second pallet holder 39 is attached to side walls 22 and center wall 23 of pallet table 10, respectively. These first pallet holder 38 and second pallet holder 39 extend such that they cover a part of pallet section 24 on pallet table 10 so that dish member 40 placed in pallet section 24 does not protrude upward.

After attaching pallet table 10 to feeder base 2*a* of component mounter 1, trays 50 containing components are placed on dish member 40. When this dish member 40 is manually inserted from pallet inlet 25 open to outside into pallet section 24, front wall 41*b* of dish member 40 makes contact with positioner 27 (elastic member 28) on pallet table 10 at the back, and then is caught in locking part 29 so that dish member 40 is fixed (locked) in pallet section 24. At this point, dish member 40 is fixed onto pallet table 10 at a position, as described previously, that trays 50 placed on dish member 40 enter into movement area R of transfer head 5. Accordingly, eight trays 50 (including component collecting tray 50*a*) can be supplied to movement area R of transfer head 5 just by inserting dish member 40, on which trays 50 are placed, to pallet table 10 if components to be mounted are set in trays 50 to be placed in movement area R of transfer head 5.

Even when transfer head 5 erroneously tries to vacuum-hold a component from component space 51 where no component exists, tray 50 is fixed to dish member 40 by magnet 42, as described previously. In addition, first pallet holders 38 and second pallet holder 39 prevent dish member 40 from coming out of pallet section 24 on pallet table 10. Accordingly, even when transfer head 5 directly vacuum-holds tray 50, tray 50 and dish member 40 will not be lifted up directly.

This component mounter 1, as shown in FIG. 9, includes transfer rail driving mechanism 61, X-axis table movement mechanism 62, transfer stage movement mechanism 63, nozzle driving mechanism 64, nozzle suction mechanism 65, and tape feeder driving mechanism 66. Transfer rail driving mechanism 61 drives board transfer rail 4. X-axis table movement mechanism 62 moves X-axis table 6b along Y-axis table 6a. Transfer stage movement mechanism 63 moves transfer stage 6c along X-axis table 6b. Nozzle driving mechanism 64 elevates each nozzle 5a and rotates each nozzle 5a around a vertical shaft. Nozzle suction mechanism 65 makes each nozzle 5a pick up a component by suction. Tape feeder driving mechanism 66 drives each tape feeder 7.

Controller 60 in component mounter 1 controls the operation of these mechanisms 61 to 66. Board camera 67 (see FIG. 11) whose imaging area is directed downward is provided on transfer head 5, and component camera 68 (see FIG. 7) whose imaging area is directed upward is provided on base 2. Controller 60 controls the operation of these board camera 67 and component camera 68. Information on the image-taking results of these board camera 67 and component camera 68 is input to controller 60.

In FIG. 9, memory 69 connected to controller 60 stores a mounting program in advance. Controller 60 executes this mounting program stored in memory 69 for mounting components on board 3. In a component mounting cycle for one board 3, board 3 on which components are to be mounted is transferred and positioned by board transfer rail 4 at a predetermined position. Transfer head 5 is then moved over board 3 to visually detect a reference mark (not illustrated) provided on a corner of board 3 by board camera 67. Here, the positional deviation of board 3 is detected based on how much a positional deviation detection mark deviates from a predetermined reference position.

After detecting the positional deviation of board 3, controller 60 moves transfer head 5, and repeats component placement. In the placement operation of each component onto board 3, each nozzle 5a picks up (by suction) a component supplied to movement area R of transfer head 5 by tape feeder 7 or hand tray 8. See also FIG. 12, steps b), d) and g). The component picked up then passes the viewing field of component camera 68 to allow an image of the component to be taken by component camera 68 for detecting any positional deviation of the component relative to nozzle 5a. The component is placed on board 3 such that positional deviation of board 3 and positional deviation of the component are corrected.

After mounting all the components to be placed on one board 3, board 3 on which the components have been mounted is fed to the next step by board transfer rail 4. Next, board 3 on which components are to be mounted is transferred and positioned by board transfer rail 4, and components are mounted in the same way.

In each tray 50 on hand tray 8, components ready for mounting on board 3 (i.e., before pickup) are aligned and set in predetermined positions. Accordingly, controller 60 has accurate information on the position of each component in each tray 50. This enables controller 60 to move transfer head 5 over each component and pick up the components sequentially.

Controller 60 counts the number of components picked up from each tray 50 so as to always detect the remaining number of components in each tray 50. This information on remaining components in each tray 50 (i.e., in each pallet 4) is announced visually and auditorily to the operator via display panel 70 (FIG. 1) provided on base 2 at the side of hand tray 8. The information on the remaining components in each dish member 40 is displayed by controller 60 as the number of components remaining in each tray 50, a message informing that the remaining number has reached a predetermined number (normally 0, but 1 or 2 is also acceptable) and that refill is needed, and so on.

FIG. 10 shows an example of display section 71 of display panel 70 provided on base 2 at the side of hand tray 8. In this display section 71, eight lamps 72 corresponding to eight trays 50 (including component collecting tray 50a), respectively, in two pallets 40 inserted to base 2 are aligned in the same order as eight trays 50 (see FIG. 7 for alignment as seen from above pallet table 10). In FIG. 10, a lamp corresponding to component collecting tray 50a is given a reference mark of 72a.

Controller 60 controls the turning on and off and blinking of these eight lamps 72. For seven lamps 72 corresponding to seven trays 50, excluding one corresponding component collecting tray 50a, each lamp remains on-state if the remaining number of components has not reached the predetermined number. When the predetermined number has been reached, the corresponding lamp turns off (or blinks). The operator of component mounter 1 can thus readily determine, by looking at display section 71 of display panel 70, whether components remain in each tray 50 or each dish member 40, or whether components need to be refilled to each dish member 40. In this example, dish member 40 needs component refill when all of its lamps 72 (excluding lamp 72a corresponding to component collecting tray 50a) are turned off. The operator then removes only that dish member 40 from base 2 (from pallet table 10), refills with components, and inserts that dish member 40 back to base 2. See also FIG. 12, steps c), e), f) and h)-j). As described previously, controller 60 continuously monitors the number of components remaining in each tray 50, and thus transfer head 5 will not be moved over dish member 40 whose remaining number of components has reached 0. Accordingly, component mounting operation by transfer head 5 is not affected, even when dish member 40 is removed from base 2.

In the case of tape feeder 7, a remaining component detector (not illustrated) for detecting the remaining number of components is provided on tape feeder 7 itself. This information is shown on a display panel (not illustrated) provided on base 2 at the side of tape feeder 7 via controller 60 to announce the information to the operator.

As described above, component mounter 1 in the preferred embodiment includes board transfer rail 4 for positioning board 3 at a predetermined position on base 2, transfer head 5 for picking up the component supplied and placing it on board 3 positioned by board transfer rail 4, and multiple pallets 40 (dish members) for supplying components to movement area R of transfer head 5. Each dish member 40 is manually inserted to base 2, and is independently removable from base 2.

The component supply method for this component mounter 1 includes the step of manually inserting multiple pallets 40 to base 2 and supplying components placed on each dish member 40 to movement area R of transfer head 5. This component supply method also includes the step of removing dish member 40 that needs component refill and will be refilled from base 2, and inserting that dish member 40 back to base 2 after refilling with components.

In component mounter 1 and the component supply method for this component mounter 1 in this preferred embodiment, multiple removable pallets 40 (dish members) are removably inserted to base 2 for supplying components placed on each dish member 40 to movement area R of transfer head 5. Accordingly, a wide variety of components can be supplied, as in a conventional tray feeder, using an inexpensive structure if different types of components are placed in each dish member 40. Since each dish member 40 is independently removable from base 2, only dish member 40 that needs refilling can be removed from base 2, and dish member 40 is inserted back to base 2 after refilling with components. There is thus no need to open the cover (movable cover 9b) of component mounter 1 to refill with components, and the mounting operation thus does not stop because the safety device is not activated. In addition, since dish member 40 is removable from outside base 2, the operator does not need to physically place dish member 40 inside mounter 1. This also facilitates component refill.

Still more, this component mounter 1 includes a remaining component detector (controller 60) for detecting the remaining number of components in each dish member 40 inserted to base 2 and an announcement unit (controller 60 and display panel 70) that announces the state of remaining components in each dish member 40 based on the number of components remaining in each dish member 40 detected by the remaining component detector. Accordingly, the operator can start refilling dish member 40 with components at an appropriate timing based on the state, which is announced by the announcement unit, of the remaining components in each dish member 40.

In this component mounter 1, a lock unit may have a structure in which each dish member 40 inserted to base 2 via pallet table 10 is locked to prevent removal from base 2, and dish member 40 is unlocked when the remaining number of components in dish member 40 reaches a predetermined quantity (normally 0) to start refill. An example of this type of lock unit is a structure that restricts oscillation of the aforementioned oscillating bar 32, which fixes each dish member 40 to pallet table 10 in a releasable manner, by expansion and contraction of a separately provided pneumatic cylinder. Controller 60 controls the operation of this pneumatic cylinder to permit downward oscillation of oscillating bar 32 only when the remaining number of components in dish member 40 reaches a predetermined quantity requiring refill. Alternatively, a mechanism for detecting the downward oscillation of oscillating bar 32 by a separate sensor may be provided to suppress the operation of oscillating bar 32 or announce an error as required.

In the aforementioned component mounting operation, some of the components picked up by transfer head 5 may be determined as inappropriate for placement on board 3 based on image recognition using component camera 68 before they are placed on board 3 (for example, due to partial deformation of a component). Determination is made by controller 60 based on images taken by component camera 68. In this case, controller 60 moves transfer head 5 over component collecting tray 50a to place the component to be collected (hereafter referred to as "collecting component P" in FIG. 11) into component collecting tray 50a, without placing the component determined to be inappropriate for mounting on board 3.

Controller 60 controls transfer head 5 to place collecting component P collected on component collecting tray 50a in a predetermined order starting from reference position 73 (see FIG. 11) set in component collecting tray 50a. Reference position 73 is set in component collecting tray 50a as a fixed position not dependent on the size of components to be collected. Placement positions 73a, 73a, 73 a, and so on (see FIG. 11), where collecting components P collected on and the second or later one will be placed, are set in component collecting tray 50a in a predetermined order referring to reference position 73. The distance between placement positions 73a is determined according to the size of collecting component P.

During component mounting operations, controller 60 continuously identifies the number of components placed in component collecting tray 50a (hereafter referred to as "collected component number") based on the number of times that collecting component P is placed in collecting tray 50a. Until this collected component number reaches the collectable number of components as determined by the size of components relative to component collecting tray 50a (hereafter referred to as "collectable component number"), lamp 72a corresponding to component collecting tray 50a remains on, and collecting components P are collected as required (the operation of placing collecting component P in component collecting tray 50a). On the other hand, when the collected component number reaches the collectable component number, lamp 72a blinks and controller 60 enters "collected components standby mode." This is a mode for continuing the mounting operation until the next collecting component P to be collected is found, and then interrupting the component mounting operation when collecting component P is found, without executing collection.

If the collected component number reaches the collectable component number, and controller 60 enters "collecting component standby mode," lamp 72a corresponding to component collecting tray 50a changes from a lighting state to a blinking state. Therefore, the operator can precisely understand the time when he/she should take out collecting components P from component collecting tray 50a. When lamp 72a corresponding to component collecting tray 50a starts to blink, the operator will immediately remove dish member 40 containing component collecting tray 50a (only that dish member 40) from base 2 (from pallet table 10) to take out collecting components P from component collecting tray 50a. Then, emptied component collecting tray 50a is placed on dish member 40, and inserted back to base 2. A predetermined operation is performed on controller 60 to reset data for the collected component number stored in controller 60 to the initial value (0).

When the collected component number is reset to the initial value, controller 60 restarts the placement of collecting components P in component collecting tray 50a. The first collecting component P collected after reset is placed on reference position 73 in component collecting tray 50a. Collecting components P collected after the first one are placed in the order of predetermined placement positions 73a, 73a, 73a, and so on (positions set in a predetermined arrangement with reference to reference position 73).

If a component in another tray 50 in the same dish member 40 containing component collecting tray 50a is already picked up when lamp 72a corresponding to component collecting tray 50a changes from the lighting state to a blinking state, a predetermined operation is performed on controller 60 to interrupt the component mounting operation, and collecting components P are taken out from component collecting tray 50a.

As described above, the operator needs to take out collecting components P from component collecting tray 50a, and reset data on the collected component number stored in controller 60 to the initial value when the collecting component number reaches the collectable component number. In addition, when execution of a mounting program itself is reset, typically due to a changeover of the type of board 3 to be manufactured (hereafter referred to as "produced board"), the data on collected component number stored in controller 60 is automatically reset to the initial value. Accordingly, in this case, the operator needs to take out collecting components P in component collecting tray 50*a*. Otherwise, the first collecting component P collected after reset will be placed over remaining collecting components P in component collecting tray 50*a*, resulting in inconvenience such as scratches on collecting components P due to contact or damage to transfer head 5.

In fact, however, the operator may forget to take out collecting components P in component collecting tray 50*a*, which should be done when execution of the mounting program itself is reset. Accordingly, component mounter 1 in this preferred embodiment has a measure for preventing such inconvenience. A detailed structure is described below.

In FIG. 11, mark 74 is provided on reference position 73. This mark 74 is visible from above when collecting component P is not placed on reference position 73. However, it is not visible when collecting component P is placed on reference position 73, because that collecting component P hides mark 74.

After resetting the data on collected component number or after resetting the mounting program, controller 60 places the first collecting component P on reference position 73 in component collecting tray 50*a*. At this point, board camera 67 over component collecting tray 50*a* visually recognizes aforementioned mark 74 so as to detect whether reference position 73 is vacant.

If board camera 67 visually recognizes mark 74, controller 60 determines that collecting component P is not placed on reference position 73 and reference position 73 is thus vacant. If board camera 67 does not visually recognize mark 74, controller 60 determines that collecting component P is placed on reference position 73, and reference position 73 is not vacant. Mark 74 provided on reference position 73 in component collecting tray 50*a* and board camera 67 for visually recognizing this mark 74 from above thus configure a vacant space detector for detecting whether reference position 73 is vacant or not, before placing collecting component P on reference position 73.

If the above vacant space detector detects that reference position 73 is vacant, controller 60 determines that collecting components P in component collecting tray 50*a* are already taken out. If the vacant space detector detects that reference position 73 is not vacant, controller 60 determines that collecting components P in component collecting tray 50*a* are not taken out yet. When controller 60 determines that collecting components P in component collecting tray 50*a* are already taken out, collecting component P is placed on component collecting tray 50*a*. If controller 60 determines that collecting components P in component collecting tray 50*a* are not taken out yet, controller 60 prevents the inconvenience of placing collecting component P over collecting component P already collected in component collecting tray 50*a*. Accordingly, transfer head 5 does not place collecting component P on component collecting tray 50*a*, and a predetermined announcement operation is executed to inform of the state to the operator typically via display panel.

As described above, controller 60 makes the vacant space detector detect whether reference position 73 is vacant before placing collecting component P on reference position 73. If the vacant space detector detects that reference position 73 is vacant, collecting component P is placed on component collecting tray 50*a*. If the vacant space detector detects that collecting components P are not taken out from component collecting tray 50*a* yet, placement of collecting component P on component collecting tray 50*a* by transfer head 5 is stopped, and also this state (the state in which collecting components P are not yet taken out from component collecting tray 50*a*) is informed to the operator. This enables the operator to recognize that collecting components P have not yet been taken out from component collecting tray 50*a*, which should have been done. Accordingly, the operator can take the necessary action to take out collecting components P from component collecting tray 50*a*.

Controller 60 does not execute placement of collecting component P on component collecting tray 50*a* when controller 60 determines that collecting components P in component collecting tray 50*a* have not yet been taken out. Then, when the operator subsequently takes out collecting components P from component collecting tray 50*a*, board camera 67 is moved over component collecting tray 50*a* so as to visually recognize mark 74. As a result, when mark 74 is visually recognized by board camera 67 (i.e., when the vacant space detector detects that reference position 73 is vacant), controller 60 determines that collecting components P in component collecting tray 60*a* are already taken out, and placement of collecting component P on component collecting tray 50*a* is executed.

As described above, component mounter 1 in the preferred embodiment includes component collecting tray 50*a* for placing collecting components P in a line. Collecting component P is collected based on determination that a component picked up by transfer head 5 is inappropriate for placement on board 3, before it is placed on board 3. In addition, this component mounter 1 includes a collection controller (controller 60) for controlling transfer head 5 to place collecting component P in a predetermined order from reference position 73 on component collecting tray 50*a*, and the vacant space detector (mark 74 and board camera 67) for detecting whether or not reference position 73 is vacant before placing collecting component P on reference position 73. Controller 60 as the collection controller executes placement of collecting component P on component collecting tray 50*a* when the vacant space detector detects that reference position 73 is vacant.

Still more, the component collection method of this component mounter 1 collects and places components on component collecting tray 50*a* in a line without placing these components on board 3 when the components picked up by transfer head 5 are determined inappropriate for placement, before it is placed on board 3. Collecting component P is placed in a predetermined order sequentially from reference position 73 set on component collecting tray 50*a*. On placing collecting component P on reference position 73, whether reference position 73 is vacant or not is detected. When reference position 73 is detected vacant, collecting component P is placed on component collecting tray 50*a*.

In component mounter 1 and the component collecting method for this component mounter 1 in this preferred embodiment, collecting component P is placed on component collecting tray 50*a* in a predetermined order sequentially from reference position 73. At the same time, whether reference position 73 is vacant or not is detected before placing collecting component P on reference position 73. When reference position 73 is detected vacant (it means that collecting components in component collecting tray 50*a* are already taken out), placement of collecting component P on component collecting tray 50*a* is executed. This prevents scratches on collecting component P or damage to transfer head 5 even when the operator forgets to take out collecting components P in component collecting tray 50*a*, which should be done, typically after changing a model of boards to be manufactured.

Whether reference position 73 in component collecting tray 50*a* is vacant or not is determined based on visual recognition of mark 74 provided on reference position 73 using board camera 67 moved over component collecting tray 50a. This is an extremely simple structure but an extremely secure approach for making determination (whether collecting components P in component collecting tray 50a are already taken out or not).

Mark 74, as described previously, is provided on reference position 73 in component collecting tray 50a. Any mark is acceptable as long as it is visually recognizable from above when no collecting component P is placed on reference position 73, but is not visible from above when collecting component P is placed on reference position 73 because collecting component P hides mark 74. For example, a small hole (pinhole) created in the bottom face of component collecting tray 50a is acceptable in addition to a mark attached (or drawn) on the bottom face of component collecting tray 50a.

Whether reference position 73 on component collecting tray 50a is vacant or not may also be determined by directly checking whether collecting component P is present on reference position 73 using board camera 67 over component collecting tray 50a. If this structure is adopted, the vacant space detector is configured only with board camera 67. However, board camera 67 is originally provided for visually recognizing a detection mark (described previously) provided on board 3 for detecting extremely minute positional deviations. The viewing field of board camera 67 is therefore very narrow. In a case where collecting component P is directly inspected, it is not possible to determine whether collecting component P is present on reference position 73 if its entire viewing field is occupied by collecting component P. It is thus preferable to provide mark 74 on reference position 73 in component collecting tray 50a and visually inspect this mark using board camera 67 moved over component collecting tray 50a, as described in this preferred embodiment, to determine whether reference position 73 is vacant. With this structure, an accurate determination can be made, even when the viewing field of board camera 67 is narrow. If mark 74 is a small hole, it has the advantage that it can be easily recognized even when the bottom face of component collecting tray 50a is in shadow.

In the preferred embodiment, two dish members (pallets 40) independently removable from board 2 are provided. However, the number of these dish members is not limited to two as long as they consist of a plural number. Still more, in the preferred embodiment, the remaining component detector for detecting the remaining number of components in each dish member 40 inserted to board 2 recognizes (detects) the remaining number of components in each tray 50 based on a count of the number of components picked up from each tray 50 by controller 60. However, other structures are also applicable. For example, the remaining number of components in each tray 50 may be detected by counting the number of components passing the viewing field of component camera 68. Furthermore, in the preferred embodiment, the announcement unit announces the state of remaining components in each dish member 40 based on the number of remaining components in each dish member 40 as detected by the remaining component detector. This announcement unit includes controller 60 and display panel 70 whose operation is controlled by controller 60. However, other devices such as a liquid crystal display are also applicable instead of display panel 70.

Figure 12:
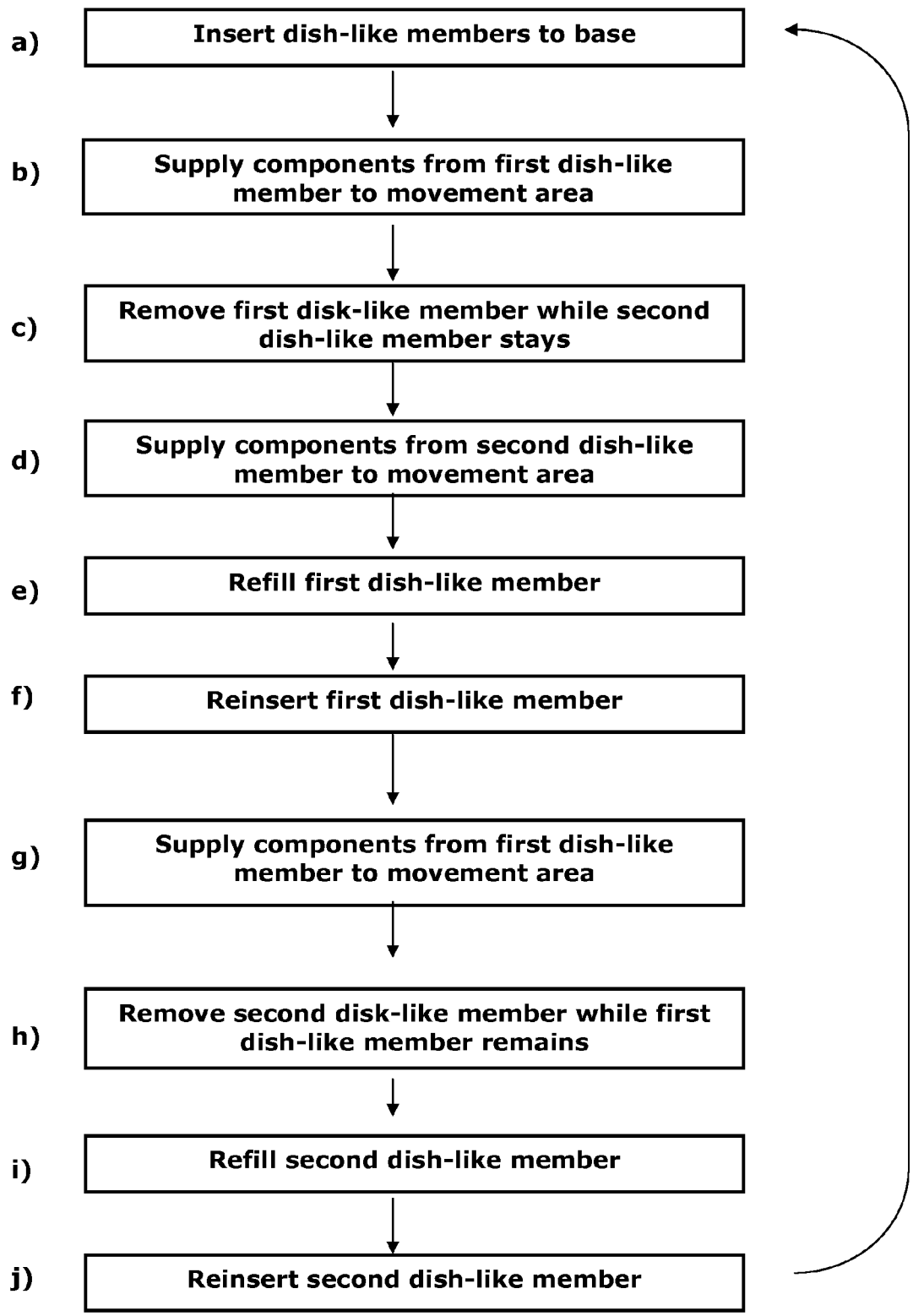
FIG. 12 is a flow chart diagram which illustrates operation of an exemplary embodiment of the present invention.

FIG. 12 is a flowchart diagram which illustrates operation of an exemplary embodiment of the present invention. Of course, one of ordinary skill in the art would understand that the order of some steps may be changed. As shown at step a), dish members are inserted to the base. At step b), components are supplied from the first dish member to a movement area. At step c), the first dish member is removed while a second dish member stays. At step d), components are supplied from the second dish member to the movement area. At step e), the first dish member is refilled. At step f), the first dish member is reinserted. At step g), components are supplied from the first dish member to the movement area. At step h), the second dish member is removed while the first dish member remains. At step i), the second dish member is refilled. At step j), the second dish member is reinserted. Finally, the method can proceed back to step a).

It is apparent from the above description that the component mounter of the present invention facilitates components refill without interrupting mounting operations.

What is claimed is:

1. A component supply method operatively associated with a component mounter, the component mounter including a transfer head for picking up components the method comprising:
 a) inserting a plurality of dish members to a base, wherein components are in a first of the dish members and components are in a second of the dish members;
 b) supplying the components from the first of the dish members to a movement area of the transfer head;
 c) removing the first of the dish members while the second of the dish members stays inserted;
 d) supplying the components from the second of the dish members to the movement area of the transfer head;
 e) refilling the components of the first of the dish members;
 f) reinserting the first of the dish members to the base;
 g) supplying the components from the first of the dish members to the movement area of the transfer head;
 h) removing the second of the dish members while the first of the dish members stays inserted;
 i) refilling the components of the second of the dish members;
 j) reinserting the second of the dish members to the base;
 k) repeating previous steps b) to j).

* * * * *